(12) United States Patent
Ayazi et al.

(10) Patent No.: US 8,381,378 B2
(45) Date of Patent: Feb. 26, 2013

(54) METHODS OF FORMING MICROMECHANICAL RESONATORS HAVING HIGH DENSITY TRENCH ARRAYS THEREIN THAT PROVIDE PASSIVE TEMPERATURE COMPENSATION

(75) Inventors: Farrokh Ayazi, Atlanta, GA (US);
Roozbeh Tabrizian, Atlanta, GA (US);
Giorgio Casinovi, Tucker, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 413 days.

(21) Appl. No.: 12/794,361

(22) Filed: Jun. 4, 2010

(65) Prior Publication Data
US 2010/0319185 A1 Dec. 23, 2010

Related U.S. Application Data

(60) Provisional application No. 61/218,518, filed on Jun. 19, 2009, provisional application No. 61/314,290, filed on Mar. 16, 2010.

(51) Int. Cl.
*H01L 41/22* (2006.01)
*H04R 17/00* (2006.01)

(52) U.S. Cl. ............ 29/25.35; 29/594; 29/846; 333/187; 333/193

(58) Field of Classification Search .................. 29/25.35, 29/592.1, 594, 595, 832, 846; 331/68, 154, 331/155; 333/187, 193
See application file for complete search history.

(56) References Cited

U.S. PATENT DOCUMENTS 5,160,901 A 11/1992 Stone
5,229,735 A 7/1993 Quan
5,640,133 A 6/1997 MacDonald et al.
6,557,419 B1 5/2003 Herb et al.
6,604,266 B1 8/2003 Tajima et al.
6,657,363 B1 12/2003 Aigner
6,739,190 B2 5/2004 Hsu et al.
7,071,793 B2 7/2006 Lutz et al.
7,199,504 B2 4/2007 Komuro et al.
(Continued)

FOREIGN PATENT DOCUMENTS

EP 1 217 735 A1 6/2002
EP 2 144 369 A1 1/2010

OTHER PUBLICATIONS

International Preliminary Report on Patentability Corresponding to International Application No. PCT/US2010/037429; Date of Mailing: Jan. 5, 2012; 18 pages.

(Continued)

*Primary Examiner* — A. Dexter Tugbang
*Assistant Examiner* — Jeffrey T Carley
(74) *Attorney, Agent, or Firm* — Myers Bigel Sibley & Sajovec, P.A.

(57) ABSTRACT

A method of forming a micromechanical resonator includes forming a resonator body anchored to a substrate by at least a first anchor. This resonator body may include a semiconductor or other first material having a negative temperature coefficient of elasticity (TCE). A two-dimensional array of spaced-apart trenches are provided in the resonator body. These trenches may be filled with an electrically insulating or other second material having a positive TCE. The array of trenches may extend uniformly across the resonator body, including regions in the body that have relatively high and low mechanical stress during resonance. This two-dimensional array (or network) of trenches can be modeled as a network of mass-spring systems with springs in parallel and/or in series with respect to a direction of a traveling acoustic wave within the resonator body during resonance.

12 Claims, 3 Drawing Sheets

U.S. PATENT DOCUMENTS

| | | | |
|---|---|---|---|
| 7,202,761 | B2 | 4/2007 | Lutz et al. |
| 7,280,007 | B2 | 10/2007 | Feng et al. |
| 7,312,674 | B2 | 12/2007 | Duwel et al. |
| 7,446,620 | B2 | 11/2008 | Partridge et al. |
| 7,489,063 | B2 | 2/2009 | Isobe et al. |
| 7,608,980 | B2 | 10/2009 | Kataoka |
| 7,616,077 | B1 | 11/2009 | Wittwer et al. |
| 7,639,104 | B1 | 12/2009 | Quevy et al. |
| 7,675,389 | B2 | 3/2010 | Yamakawa et al. |
| 2002/0096967 | A1 | 7/2002 | Ma et al. |
| 2005/0146248 | A1 | 7/2005 | Moler et al. |
| 2005/0242904 | A1 | 11/2005 | Lutz et al. |
| 2006/0125576 | A1 | 6/2006 | Ho et al. |
| 2006/0196273 | A1 | 9/2006 | Burns |
| 2006/0225504 | A1 | 10/2006 | Ayazi et al. |
| 2007/0069612 | A1 | 3/2007 | Sato |
| 2007/0188269 | A1 | 8/2007 | Lutz et al. |
| 2007/0220971 | A1 | 9/2007 | Ayazi et al. |
| 2007/0277620 | A1 | 12/2007 | Melamud et al. |
| 2008/0143217 | A1 | 6/2008 | Ho et al. |
| 2008/0186109 | A1* | 8/2008 | Ho et al. .................. 333/197 |
| 2009/0153267 | A1 | 6/2009 | Lutz et al. |
| 2009/0160581 | A1 | 6/2009 | Hagelin et al. |
| 2010/0032789 | A1 | 2/2010 | Schoen et al. |

OTHER PUBLICATIONS

"Film Bulk Acoustic-Wave Resonator (FBAR)," Admitted Prior Art, http://mems.usc.edu/fbar.htm, Printed from the Internet Jan. 6, 2009, 3 pages.

"Finite element method," Admitted Prior Art, http://en.wikipedia.org/wiki/Finite_element_method, Printed from the Internet Oct. 28, 2008, 7 pages.

Abdolvand et al., "A Low Voltage Temperature-Stable Micromechanical Piezoelectric Oscillator," *Digest of the 14th International Conference on Solid State Sensors, Actuators and Microsystems* (Transducers '07), Lyon, France, Jun. 2007, pp. 53-56.

Abdolvand et al., "A Temperature-Compensated ZnO-on-Diamond Resonant Mass Sensor," *Proc. 5th IEEE Conference on Sensors*, 2006, pp. 1297-1300.

Abdolvand et al., "Single-Resonator Dual-Frequency Thin-Film Piezoelectric-on-Substrate Oscillator", *IEEE International Electron Devices Meeting*, 2007, pp. 419-422.

Casinovi et al., "Analytical Modeling and Numerical Simulation of Capacitive Silicon Bulk Acoustic Resonators," IEEE International Conference on Micro Electro Mechanical Systems, Jan. 2009, pp. 935-938.

Dubois, Marc-Alexandre., "Thin film bulk acoustic wave resonators: a technology overview," MEMSWAVE 03, Toulouse, France, Jul. 2-4, 2003.

Ho et al., "High Order Composite Bulk Acoustic Resonators," *Proc. 20th IEEE International Conference on Micro Electro Mechanical Systems* (MEMS '07), Kobe, Japan, Jan. 2007, pp. 791-794.

Ho et al., "Temperature Compensated IBAR Reference Oscillators," *Proc. 19th IEEE International Conference on Micro Electro Mechanical System*,(MEMS '06), Istanbul, Turkey, Jan. 2006, pp. 910-913.

Jaakkola et al., "Piezoelectrically transduced Single-Crystal-Silicon Plate Resonators," VTT Technical Research Centre of Finland, Finland.

Kim et al., "Temperature Dependence of Quality Factor in MEMS Resonators," Journal of Microelectromechanical Systems, vol. 17, No. 3, Jun. 2008, pp. 755-766.

Lin et al., "Series-Resonant VHF Micromechanical Resonator Reference Oscillators," *IEEE Journal of Solid-State Circuits*, vol. 39, No. 12, Dec. 2004, pp. 2477-2491.

Luoto et al., "MEMS on cavity-SOI wafers," Solid State Electronics 51:328-332 (2007).

Nam et al., "Piezoelectric Properties of Aluminum Nitride for Thin Film Bulk Acoustic Wave Resonator," J. Korean Physical Society, 47:S309-S312 (2005).

Pourkamali et al., "Low-impedance VHF and UHF Capacitive Silicon Bulk Acoustic Wave Resonators—Part I: Concept and Fabrication," IEEE Transaction on Electron Devices, vol. 54, No. 8, Aug. 2007, pp. 2017-2023.

Schodowski, "Resonator Self-Temperature-Sensing Using a Dual-Harmonic-Mode Crystal Oscillator," *Proc. of the 43rd Annual Symposium on Frequency Control*, Jun. 1989, pp. 2-7.

Sundaresan et al., "A Low Phase Noise 100MHz Silicon BAW Reference Oscillator," *Proc. IEEE Custom Integrated Circuits Conference*, Sep. 2006, pp. 841-844.

Vig, "Dual-mode Oscillators for Clocks and Sensors," *Procs. IEEE Ultrasonics Symposium*, vol. 2, No., 1999, pp. 859-868.

Schoen et al., "Temperature Compensation in Silicon-Based Micro-Electromechanical Resonators", IEEE Conference on Micro Electromechanical Systems 2009, Jan. 25, 2009, pp. 884-887, XP031444436, figures 1-3.

Baborowski et al., "Piezoelectrically Activated Silicon Resonators", IEEE Frequency Control Symposium, 2007 Joint with the 21st European Frequency and Time Forum, May 1, 2007, pp. 1210-1213, XP031138158, section I.

Notification of Transmittal of the International Search Report and the Written Opinion of the International Searching Authority , or the Declaration, International Search Report, Written Opinion of the International Searching Authority, PCT/US2010/037429, Date of Mailing: Sep. 6, 2010, 28 pages.

Tabrizian R. et al., "Temperature-Stable High-Q ALN-on-Silicon Resonators with Embedded Array of Oxide Pillars", *Solid-State Sensors, Actuators, and Microsystems Workshop*, (Hilton Head 2010), Hilton Head Island, SC, Jun. 2010, pp. 100-101; 2 pages.

Kim et al., "Micromechanical Resonant Displacement Gain Stages,"IEEE, 2009, pp. 19-22.

* cited by examiner

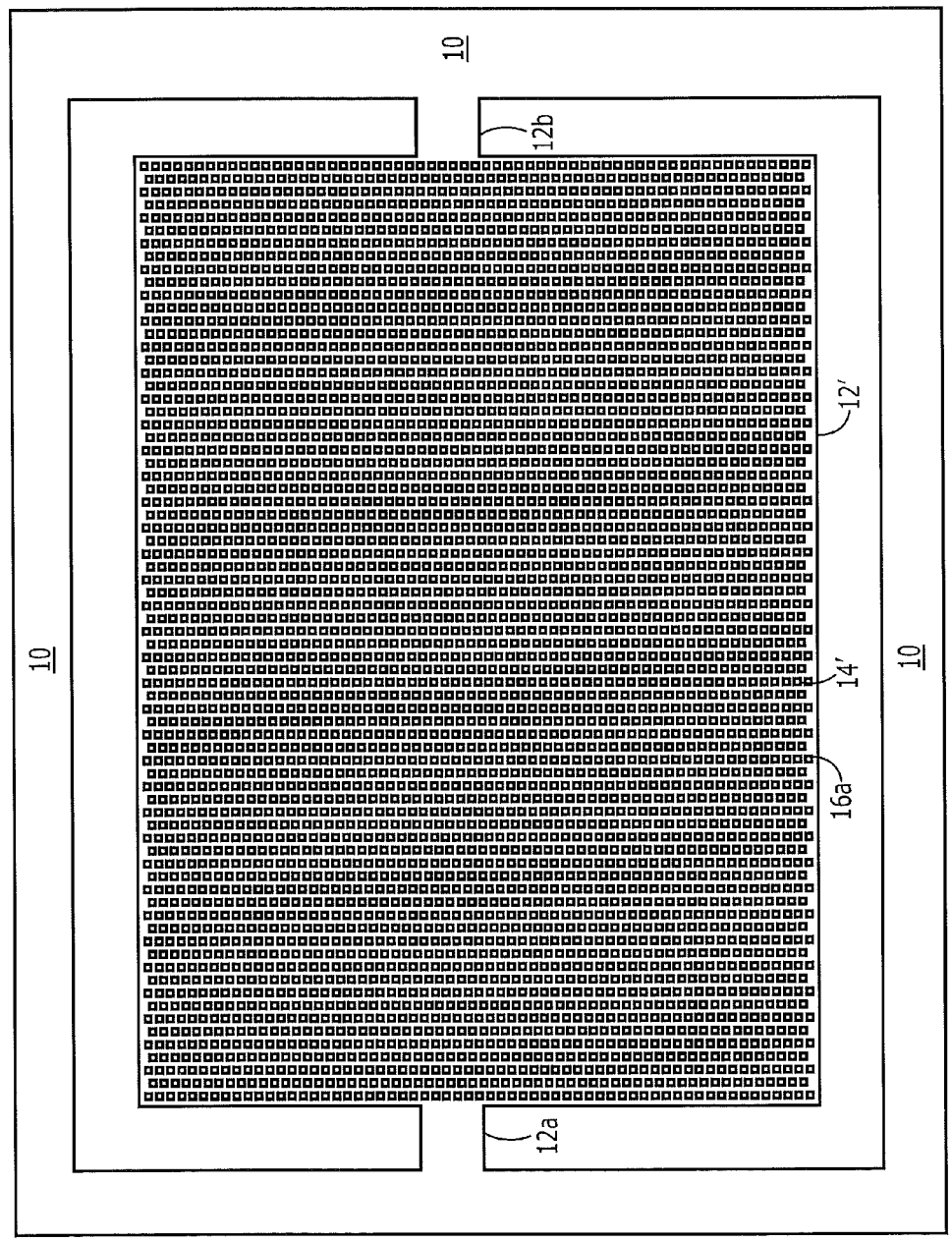

METHODS OF FORMING MICROMECHANICAL RESONATORS HAVING HIGH DENSITY TRENCH ARRAYS THEREIN THAT PROVIDE PASSIVE TEMPERATURE COMPENSATION

REFERENCE TO PRIORITY APPLICATIONS

This application claims priority to U.S. Provisional Application Ser. Nos. 61/218,518, filed Jun. 19, 2009 and 61/314,290, filed Mar. 16, 2010, the disclosures of which are hereby incorporated herein by reference.

REFERENCE TO RELATED APPLICATIONS

This application is related to U.S. application Ser. No. 12/535,284, filed Aug. 4, 2009, the disclosure of which is hereby incorporated herein by reference.

FIELD OF THE INVENTION

The present invention relates to integrated circuit devices and methods of forming same and, more particularly, to micromechanical devices and methods of forming same.

BACKGROUND OF THE INVENTION

Micro-electromechanical (MEMs) resonators can provide small form factor, ease of integration with conventional semiconductor fabrication techniques and high f·Q products. High frequency and high-Q width-extensional mode silicon bulk acoustic resonators (SiBARs) and film bulk acoustic wave resonators (FBARs) have demonstrated atmospheric Q factors in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

The resonant frequency of silicon micro-electromechanical resonators is dependent on the physical dimensions of the resonating structure. This causes the resonant frequency of those resonators to deviate from a designed target value in response to variations in photolithography, etching and film thickness. For example, as described in an article by G. Casinovi et al., entitled "Analytical Modeling and Numerical Simulation of Capacitive Silicon Bulk Acoustic Resonators," IEEE Intl. Conf. on Micromechanical Systems (2009), a 2 µm variation in thickness of a 100 MHz width-extensional mode SiBAR can cause a 0.5% variation in its center frequency, while lithographic variations of ±0.1 µm in the width of the resonator can cause an additional 0.5% variation in frequency.

Unfortunately, even when efforts to reduce the adverse effects of variations in photolithography, etching and film thickness on resonant frequency are successful, additional changes in resonant frequency may occur in response to changes in operating temperature. These temperature-based changes in resonant frequency can be reduced using modified fabrication processes and active compensation circuits. However, because circuit-based compensation techniques typically increase the complexity and power requirements of resonator devices, passive fabrication-based compensation techniques based on the intrinsic properties of the resonator materials are generally preferable to circuit-based compensation techniques. Conventional passive compensation techniques are disclosed in U.S. Patent Publication Nos. 2010/0032789 to Shoen et al., entitled "Passive Temperature Compensation of Silicon MEMS Devices;" and 2009/0160581 to Hagelin et al., entitled "Temperature Stable MEMS Resonator."

SUMMARY OF THE INVENTION

Methods of forming micromechanical resonators operable in a bulk acoustic mode include forming a resonator body anchored to a substrate by at least a first anchor. This resonator body may include a semiconductor or other first material having a negative temperature coefficient of elasticity (TCE). A two-dimensional array of spaced-apart trenches are provided in the resonator body. These trenches may be filled with an electrically insulating or other second material having a positive TCE. The array of trenches may extend uniformly across the resonator body, including regions in the body that have relatively high and low mechanical stress during resonance. This two-dimensional array (or network) of trenches can be modeled as a network of mass-spring systems with springs in parallel and/or in series with respect to a direction of a traveling acoustic wave within the resonator body during resonance.

To achieve a high degree of temperature compensation, the array of spaced-apart trenches may have a sufficient density in the resonator body to meet the following relationship:

$$1 \leq -R_V(\text{TCE}_I/\text{TCE}_S)[(E_I/E_S) + (\rho_I/\rho_S)^{1/2}(E_I/E_S)^{-1/2}] \leq 3,$$

where $R_V = (V_I/V_S)$; $\text{TCE}_S$, $E_S$, $\rho_S$ and $V_S$ represent the temperature coefficient of elasticity, Young's modulus, density and volume of the first material in the resonator body, respectively; and $\text{TCE}_I$, $E_I$, $\rho_I$ and $V_I$ represent the temperature coefficient of elasticity, Young's modulus, density and total volume of the second material in the array of spaced-apart trenches, respectively. Thus, in the event the first material is silicon and the second material is silicon dioxide, the ratio $R_V$ may have a value in a range from about 0.14 to about 0.42, where $\text{TCE}_S$, $E_S$ and $\rho_S$ for silicon are represented as $-52$ ppm/° C., 169 GPa and 2.33 grams/cm$^3$, respectively, and $\text{TCE}_I$, $E_I$ and $\rho_I$ for silicon dioxide are represented as 180 ppm/° C., 73 GPa and 2.63 grams/cm$^3$.

According to some embodiments of the invention, the array of spaced-apart trenches may extend partially through the resonator body or may extend entirely through the resonator body as through-body holes. According to additional embodiments of the invention, the spaced-apart trenches in the array may be arranged in a checkerboard pattern. In further embodiments of the invention, the spaced-apart trenches in the array are arranged as a two-dimensional array of spaced-apart trenches having a first plurality of rows of spaced-apart trenches and a second plurality of columns of spaced-apart trenches. According to these embodiments of the invention, each of the first plurality of rows of spaced-apart trenches has an equivalent number of spaced-apart trenches therein and each of the second plurality of columns of spaced-apart trenches has an equivalent number of spaced-apart trenches therein.

According to still further embodiments of the invention, a bottom electrode of the resonator may be formed on the resonator body, a piezoelectric layer may be formed on the bottom electrode and at least one top electrode may be formed on the piezoelectric layer. According to additional aspects of these embodiments of the invention, a combination of a number of spaced-apart trenches in the array and the second material is sufficient to fully temperature compensate the micromechanical resonator, which includes the resonator body, bottom electrode, piezoelectric layer and at least one top electrode. To achieve full or at least nearly full temperature compensation, the density of the filled trenches in the upper surface of a resonator body may be set to a value of at least five trenches/square for each square region on an upper surface of the resonator body having an area equal to $t^2$, where t is a thickness of the resonator body as measured between upper and lower surfaces thereof and t is greater than about 10 microns. Alternatively, the density of the filled trenches in the upper surface of the resonator body may be set to a value of at least one trench/square for each square region on an upper surface of the resonator body having an area equal to $t^2$, for cases where t is in a range from about 2 microns to about 10 microns.

According to additional embodiments of the invention, a method of forming a micromechanical resonator includes forming a resonator body having upper and lower surfaces thereon. This resonator body includes a first material having a negative temperature coefficient of elasticity (TCE) and a two-dimensional array of spaced-apart through-body holes filled with a second material having a positive TCE. The through-body holes may have minimum and maximum lateral dimensions in a range from about 0.1 T to about 0.2 T, where T is a thickness of the resonator body and T is greater than about 10 microns.

The step of forming a resonator body may include etching a two-dimensional array of spaced-apart trenches in the resonator body and then depositing the electrically insulating material onto a surface of the resonator body and into the two-dimensional array of spaced-apart trenches using, for example, a low pressure chemical vapor deposition technique. The step of etching a two-dimensional array of spaced-apart trenches in the resonator body may include using an etching process that alternates repeatedly between an isotropic plasma etching of the resonator body and a deposition of a chemically inert passivation layer on the resonator body.

A dry etching step may then be performed. This dry etching step may include dry etching the electrically insulating material to thereby remove portions of the electrically insulating material from the surface of the resonator body and from within the two-dimensional array of spaced-apart trenches. The depositing and dry etching steps may be repeatedly performed in sequence at least once until the two-dimensional array of spaced-apart through-body holes is formed and completely filled with the electrically insulating material.

BRIEF DESCRIPTION OF THE DRAWINGS

FIG. 1C is a plan view of a suspended resonator body having a checkerboard pattern of spaced-apart trenches therein filled with a material having a positive TCE, according to additional embodiments of the invention.

DESCRIPTION OF PREFERRED EMBODIMENTS

Figure 1A:
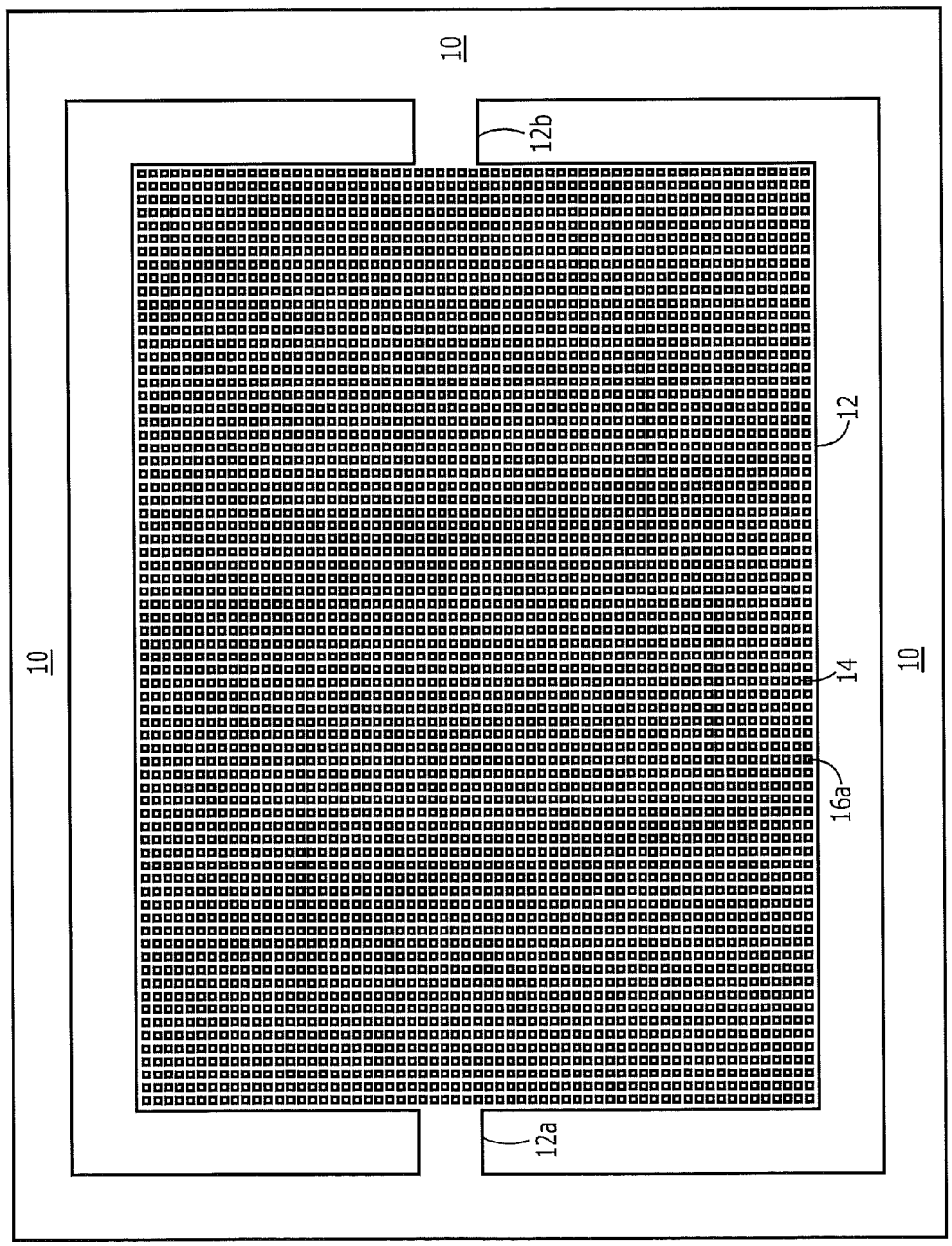
FIG. 1A is a plan view of a suspended resonator body having a two-dimensional array of spaced-apart trenches therein filled with a material having a positive TCE, according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting" of when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A illustrates a plan view of a suspended resonator body 12 of a micromechanical resonator. This resonator body 12 is suspended on opposite sides by a pair of anchors 12a, 12b, which are attached to a surrounding substrate 10 and aligned to a longitudinal axis of the resonator body 12. As highlighted by the aforementioned U.S. application Ser. No. 12/535,284, filed Aug. 4, 2009, which is hereby incorporated herein by reference, the resonator body 12 may be suspended opposite a recess in the substrate 10.

The resonator body 12 of FIG. 1A is illustrated as having a two-dimensional array of spaced-apart square trenches 14 therein, which are filled with an electrically insulating material 16a or another material having a positive temperature coefficient of elasticity (TCE). These trenches 14 may extend partially or, more preferably, completely through the resonator body 12 as through-body holes. According to some embodiments of the invention, the resonator body 12 may be configured as a semiconductor body, such as a silicon body, or another material having a negative TCE and the electrically insulating material 16a may be silicon dioxide. Similarly, the resonator body 12' of FIG. 1C is illustrated as having a checkerboard pattern of spaced-apart trenches 14 therein. Because the checkerboard pattern of spaced-apart trenches 14 may be treated as including a two-dimensional array of trenches in the spaces or gaps between the trenches of another two-dimensional array, greater temperature compensation may be provided by the embodiment of FIG. 1C relative to the embodiment of FIG. 1A.

Figure 1B:
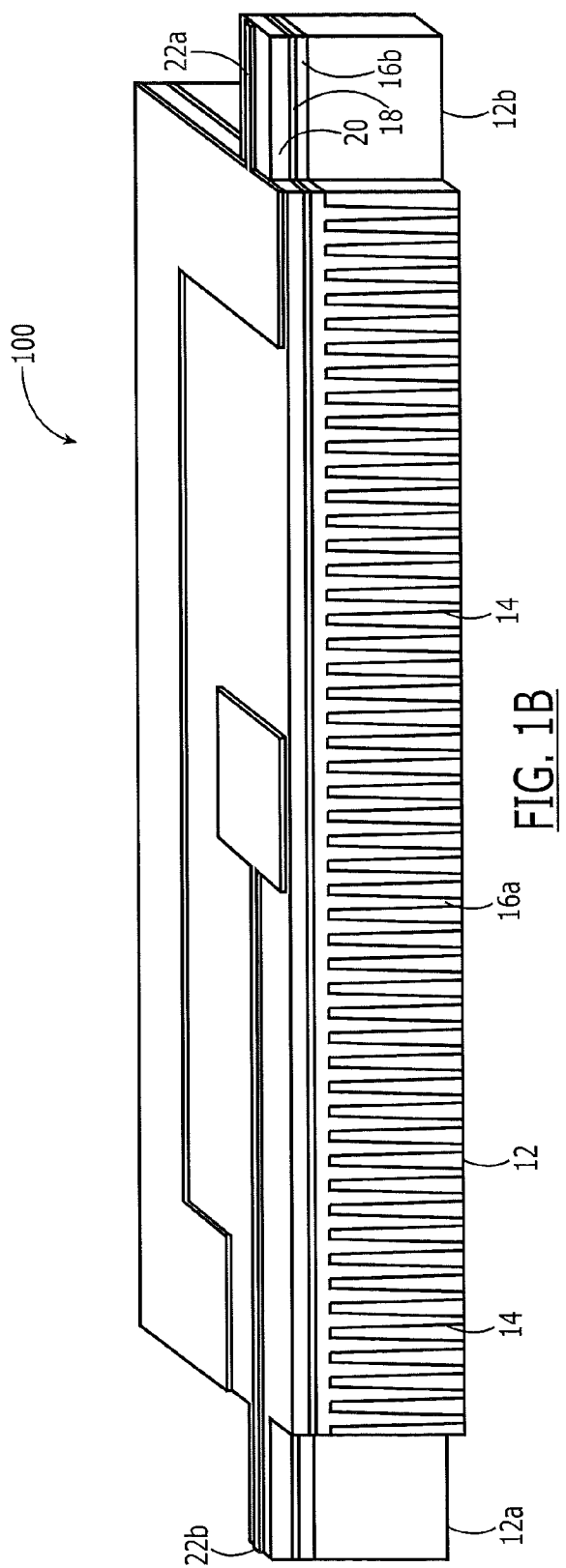
FIG. 1B is a perspective view of a micromechanical resonator operable in a bulk acoustic mode, according to embodiments of the present invention.

FIG. 1B is a perspective view of a micromechanical resonator 100 operable in a bulk acoustic mode. This resonator 100 includes a semiconductor resonator body 12 having a two-dimensional array of spaced-apart trenches 14 therein. In particular, the resonator 100 of FIGS. 1A-1B includes a resonator body 12 anchored to a surrounding substrate 10 by a pair of anchors 12a, 12b. The resonator body 12 includes a semiconductor material (e.g., silicon) and a two-dimensional array of spaced-apart square through-body holes 14, which are completely filled with an electrically insulating material 16a having a positive TCE. To achieve a high degree of temperature compensation, the density of the array of spaced-apart trenches should be sufficient to meet the following relationship:

$$0.5 \leq -R_V(TCE_I/TCE_S)[(E_I/E_S)+(\rho_I/\rho_S)^{1/2}(E_I/E_S)^{-1/2}], \quad (1)$$

where $R_V=(V_I/V_S)$; $TCE_S$, $E_S$, $\rho_S$ and $V_S$ represent the temperature coefficient of elasticity, Young's modulus, density and volume of the first material in the resonator body, respectively; and $TCE_I$, $E_I$, $\rho_I$ and $V_I$ represent the temperature coefficient of elasticity, Young's modulus, density and total volume of the second material in the array of spaced-apart trenches, respectively. More preferably, the density of the array of spaced-apart trenches should be sufficient to meet the following relationship:

$$1 \leq -R_V(TCE_I/TCE_S)[(E_I/E_S)+(\rho_I/\rho_S)^{1/2}(E_I/E_S)^{-1/2}] \leq 3. \quad (2)$$

Thus, in the event the first material is silicon and the second material is silicon dioxide, the ratio $R_V$ may have a value in a range from about 0.14 to about 0.42, where $TCE_S$, $E_S$ and $\rho_S$ for silicon are represented as $-52$ ppm/°C., 169 GPa and 2.33 grams/cm$^3$, respectively, and $TCE_I$, $E_I$ and $\rho_I$ for silicon dioxide are represented as 180 ppm/°C., 73 GPa and 2.63 grams/cm$^3$.

In addition to the insulator-filled array of through-body holes 14, some additional degree of temperature compensation may be provided by a thin electrically insulating layer 16b (e.g., SiO$_2$), which is formed directly on an upper surface of the resonator body 12. This electrically insulating layer 16b, which may remain on the resonator body 12 after the through-body holes 14 are filled, may have a planarized upper surface. Conventional techniques may then be performed to deposit a bottom resonator electrode 18 (e.g., molybdenum (Mo) electrode) on the planarized upper surface, a piezoelectric layer 20 (e.g., aluminum nitride (AlN)) on the bottom electrode 18 and a pair of electrodes 22a, 22b (e.g., input and output electrodes) on the piezoelectric layer 20.

In addition, because the semiconductor resonator body 12 is typically relatively thick, some additional constraints on the dimensions of the holes may apply. For fabrication reasons, it may be preferable that the lateral dimensions of the holes be no smaller than approximately 10% of the thickness of the resonator body. Thus, for a silicon resonator body 12 having a thickness of about 20 um, the lateral dimensions of the holes 14 should be no smaller than about 2 um. Moreover, in order to evenly distribute the holes 14 over the entire surface of the resonator body 12, the hole dimensions should be maintained close to the minimum value. This conclusion supports a requirement in some embodiments of the invention that a lateral dimension of the through-body holes be set at a range from about 0.1 T to about 0.2 T, where T is a thickness of the resonator body and T is greater than about 10 microns. Accordingly, for a silicon resonator body 12 having dimensions of 250 um wide, 143 um long and 20 um thick, a hole pattern consisting of a 24×42 matrix of equally spaced 3.1 um×3.1 um square holes satisfies a volume ratio of about 0.37.

According to still further embodiments of the invention, a bottom electrode of the resonator may be formed on the resonator body, a piezoelectric layer may be formed on the bottom electrode and at least one top electrode may be formed on the piezoelectric layer. According to additional aspects of these embodiments of the invention, a combination of a number of spaced-apart trenches in the array and the second material is sufficient to fully temperature compensate the micromechanical resonator, which includes the resonator body, bottom electrode, piezoelectric layer and at least one top electrode. To achieve full or at least nearly full temperature compensation, the density of the filled trenches in the upper surface of a resonator body may be set to a value of at least five trenches/square for each square region on an upper surface of the resonator body having an area equal to t$^2$, where t is a thickness of the resonator body as measured between upper and lower surfaces thereof and t is greater than about 10 microns. Alternatively, the density of the filled trenches in the upper surface of the resonator body may be set to a value of at least one trench/square for each square region on an upper surface of the resonator body having an area equal to $t^2$, for cases where t is in a range from about 2 microns to about 10 microns.

In order to inhibit the formation of voids within the deep insulator-filled holes 14, which have relatively large aspect ratios, steps may be taken to form trenches having sufficiently tapered sidewalls and sufficiently wide top-surface openings that are less likely to be occluded with insulating material during filling of the holes 14. In particular, steps may be taken to etch a two-dimensional array of spaced-apart trenches that extend partially through the resonator body, prior to depositing the electrically insulating material onto a surface of the resonator body 12 and into the two-dimensional array of uniformly spaced-apart trenches using a technique such as low pressure chemical vapor deposition (LPCVD). Thereafter, the electrically insulating material is dry etched to remove portions of the electrically insulating material from the surface of the resonator body and from within the two-dimensional array of uniformly spaced-apart trenches. This dry etching step may include blanket dry etching the electrically insulating material across the surface of the resonator body. More specifically, the dry etching process may alternate repeatedly between an isotropic plasma etching of the resonator body and a deposition of a chemically inert passivation layer on the resonator body. The depositing and dry etching steps are then repeatedly performed in sequence until the two-dimensional array of uniformly spaced-apart holes is formed and completely filled with the electrically insulating material. Thereafter, a sequence of steps is performed to form a bottom electrode on the resonator body, a piezoelectric layer on the bottom electrode and at least one top electrode on the piezoelectric layer. In addition, a selective etching step may be performed to etch through the resonator body material and release the resonator body opposite a recess in the substrate (e.g., by removing an underlying sacrificial material in the recess).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a micromechanical resonator operable in a bulk acoustic mode, comprising:
    forming a resonator body anchored to a substrate by at least a first anchor, said resonator body comprising a first material having a negative temperature coefficient of elasticity (TCE) and an array of spaced-apart trenches filled with a second material having a positive TCE, said array of spaced-apart trenches having a sufficient density in the resonator body to meet the following relationship:

$$1 \leq -R_V(TCE_I/TCE_S)[(E_I/E_S)+(\rho_I/\rho_S)^{1/2}(E_I/E_S)^{-1/2}] \leq 3,$$

where $R_V=(V_I/V_S)$; $TCE_S$, $E_S$, $\rho_S$ and $V_S$ represent the temperature coefficient of elasticity, Young's modulus, density and volume of the first material in the resonator body, respectively; and $TCE_I$, $E_I$, $\rho_I$ and $V_I$ represent the temperature coefficient of elasticity, Young's modulus, density and total volume of the second material in the array of spaced-apart trenches, respectively.

2. The method of claim 1, wherein the array of spaced-apart trenches comprises an array of through-body holes that extend entirely through the resonator body; and wherein the through-body holes have minimum and maximum lateral dimensions in a range from about 0.1t to about 0.2t, where t is a thickness of the resonator body and t is greater than about 10 microns.

3. The method of claim 2, wherein a density of the spaced-apart trenches in the array is at least one trench/square for each square region on an upper surface of the resonator body having an area equal to $t^2$, where t, which is a thickness of the resonator body, is in a range from about 2 microns to about 10 microns.

4. The method of claim 1, wherein the spaced-apart trenches in the array are arranged in a checkerboard pattern.

5. The method of claim 1, wherein the first material comprises silicon, the second material comprises silicon dioxide and $R_V$ has a value in a range from 0.14 to 0.42.

6. The method of claim 1, wherein the spaced-apart trenches in the array are arranged as a two-dimensional array of spaced-apart trenches having a first plurality of rows of spaced-apart trenches and a second plurality of columns of spaced-apart trenches.

7. The method of claim 6, wherein each of the first plurality of rows of spaced-apart trenches has an equivalent number of spaced-apart trenches therein.

8. The method of claim 7, wherein each of the second plurality of columns of spaced-apart trenches has an equivalent number of spaced-apart trenches therein.

9. The method of claim 1, further comprising:
    forming a bottom electrode on the resonator body;
    forming a piezoelectric layer on the bottom electrode; and
    forming at least one top electrode on the piezoelectric layer.

10. The method of claim 9, wherein a combination of a number of spaced-apart trenches in the array and the second material is sufficient to fully temperature compensate the micromechanical resonator, which comprises the resonator body, bottom electrode, piezoelectric layer and at least one top electrode.

11. The method of claim 1, wherein the resonator body has upper and lower surfaces thereon; and wherein a density of the filled trenches in the upper surface of the resonator body is at least five trenches/square for each square region on the upper surface having an area equal to $t^2$, where t is a thickness of the resonator body as measured between the upper and lower surfaces.

12. The method of claim 4, wherein the resonator body has upper and lower surfaces thereon; and wherein a density of the filled trenches in the upper surface of the resonator body is at least five trenches/square for each square region on the upper surface having an area equal to $t^2$, where t is a thickness of the resonator body as measured between the upper and lower surfaces.

* * * * *

UNITED STATES PATENT AND TRADEMARK OFFICE
CERTIFICATE OF CORRECTION

| | | |
|---|---|---|
| PATENT NO. | : 8,381,378 B2 | Page 1 of 1 |
| APPLICATION NO. | : 12/794361 | |
| DATED | : February 26, 2013 | |
| INVENTOR(S) | : Ayazi et al. | |

It is certified that error appears in the above-identified patent and that said Letters Patent is hereby corrected as shown below:

On Title Page:
Item 56, Foreign Patent Documents: Please add the reference below:
-- WO 2007/072409A2 06/2007 --

Signed and Sealed this
Twenty-ninth Day of July, 2014

Michelle K. Lee
*Deputy Director of the United States Patent and Trademark Office*